United States Patent
Stamper et al.

(10) Patent No.: US 10,931,274 B2
(45) Date of Patent: Feb. 23, 2021

(54) TEMPERATURE-SENSITIVE BIAS CIRCUIT

(71) Applicant: GLOBALFOUNDRIES U.S. Inc., Grand Cayman (KY)

(72) Inventors: Anthony K. Stamper, Burlington, VT (US); Vibhor Jain, Essex Junction, VT (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 48 days.

(21) Appl. No.: 16/252,007

(22) Filed: Jan. 18, 2019

(65) Prior Publication Data
US 2020/0235729 A1 Jul. 23, 2020

(51) Int. Cl.
| | |
|---|---|
| *H03K 17/14* | (2006.01) |
| *G05D 23/19* | (2006.01) |
| *G05D 23/24* | (2006.01) |
| *G01K 3/00* | (2006.01) |
| *H01C 7/04* | (2006.01) |

(52) U.S. Cl.
CPC ............. *H03K 17/14* (2013.01); *G01K 3/005* (2013.01); *G05D 23/1906* (2013.01); *G05D 23/24* (2013.01); *H01C 7/047* (2013.01)

(58) Field of Classification Search
CPC .... H03K 17/14; G01K 3/005; G05D 23/1906; G05D 23/24; H01C 7/047
USPC ........................................................ 307/651
See application file for complete search history.

(56) References Cited

U.S. PATENT DOCUMENTS

| | | |
|---|---|---|
| 3,614,480 A | 10/1971 | Berglund et al. |
| 6,816,351 B1 | 11/2004 | Frank et al. |
| 7,544,940 B2 | 6/2009 | Ohkubo et al. |
| 9,711,221 B1 | 7/2017 | Li |
| 2007/0133270 A1 | 6/2007 | Jeong et al. |
| 2009/0067229 A1 | 3/2009 | Kang et al. |
| 2009/0262572 A1 | 10/2009 | Krusin-Elbaum et al. |

FOREIGN PATENT DOCUMENTS

WO 2010041606 A1 4/2010

OTHER PUBLICATIONS

Hillman et al., "VO2 Switches for Millimeter and Submillimeter-wave Applications," 2015 IEEE.
Lee et al., "Anomalously low electronic thermal conductivity in metallic vanadium dioxide," Science, 355:371-74, 2017.
Shukla et al, "A steep-slope transistor based on abrupt electronic phase transition," Nature Communications, 6:7812, 2015.
Verma et al., "Demonstration of GaN HyperFETs with ALD VO2".

*Primary Examiner* — Hal Kaplan
(74) *Attorney, Agent, or Firm* — Anthony Canale; Hoffman Warnick LLC

(57) ABSTRACT

One illustrative device includes, among other things, an active device comprising a first terminal, a first bias resistor connected to the first terminal, and a first resistor comprising a first phase transition material connected in parallel with the first bias transistor, wherein the first phase transition material exhibits a first low conductivity phase for temperatures less than a first phase transition temperature and a first high conductivity phase for temperatures greater than the first phase transition temperature.

19 Claims, 3 Drawing Sheets

TEMPERATURE-SENSITIVE BIAS CIRCUIT

BACKGROUND

1. Field of the Disclosure

The disclosed subject matter relates generally to semiconductor devices and, more particularly, to a transistor with a temperature-sensitive bias circuit.

2. Description of the Related Art

In modern integrated circuits, a very high number of individual circuit elements, such as field effect transistors in the form of CMOS, NMOS, PMOS elements and the like, are formed on a single chip area. In addition to the large number of transistor elements, a plurality of passive circuit elements, such as capacitors, resistors and the like, are typically formed in integrated circuits that are used for a plurality of purposes, such as for decoupling.

Polysilicon lines may be used in the fabrication of transistors as gate electrodes. A resistor may also be created using a polysilicon line. The resistance of a polysilicon resistor is determined essentially by its length and cross-sectional area. The resistance of a polysilicon resistor changes with temperature.

Power amplifier and low-noise amplifier circuits typically employ bipolar transistor devices that are operated using a constant collector current. A polysilicon bias resistor is connected to the base terminal of the bipolar transistor. As the temperature of the device rises, the transistor current gain, β, typically decreases in advanced silicon germanium bipolar transistors, requiring an increased base current to maintain the constant collector current. The increased base current causes an increased voltage drop across the bias resistor, resulting in the need to increase the voltage applied to the base to maintain the collector current. The increased base voltage degrades efficiency and linearity for the amplifier. The increased temperature also increases the resistance of the polysilicon bias resistor further exacerbating the problem.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to the fabrication of semiconductor devices and, more particularly, to a temperature-sensitive bias circuit. One illustrative device includes, among other things, an active device comprising a first terminal, a first bias resistor connected to the first terminal, and a first resistor comprising a first phase transition material connected in parallel with the first bias transistor, wherein the first phase transition material exhibits a first low conductivity phase for temperatures less than a first phase transition temperature and a first high conductivity phase for temperatures greater than the first phase transition temperature.

Another illustrative devices includes, among other things, an active device comprising a first terminal, a first bias resistor connected to the first terminal, a first resistor comprising a first phase transition material connected in parallel with the first bias transistor, wherein the first phase transition material exhibits a first low conductivity phase for temperatures less than a first phase transition temperature and a first high conductivity phase for temperatures greater than the first phase transition temperature, a second bias resistor connected in series to the first bias resistor, and a second resistor comprising a second phase transition material connected in parallel with the second bias transistor, wherein the second phase transition material exhibits a second low conductivity phase for temperatures less than a second phase transition temperature and a second high conductivity phase for temperatures greater than the second phase transition temperature, wherein the first phase transition temperature is different than the second phase transition temperature.

One illustrative method includes, among other things, connecting a bias circuit to a base terminal of a bipolar transistor and reducing a resistance of the bias circuit responsive to a temperature of the bias circuit exceeding a first predetermined temperature.

BRIEF DESCRIPTION OF THE DRAWINGS

The disclosure may be understood by reference to the following description taken in conjunction with the accompanying drawings, in which like reference numerals identify like elements, and in which.

Figure 1:
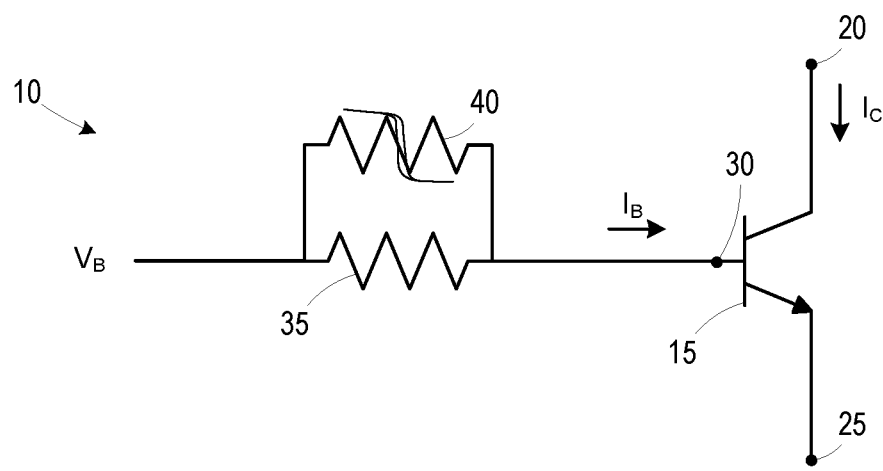
FIG. 1 is a circuit diagram of a temperature-sensitive bias circuit, according to some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an interconnect structure. With reference to the attached drawings various illustrative embodiments of the methods and devices disclosed herein will now be described in more detail.

FIG. 1 is a circuit diagram of a temperature-sensitive bias circuit 10, according to some embodiments. The circuit 10 includes a bipolar transistor 15 having a collector terminal 20, an emitter terminal 25, and a base terminal 30. A bias resistor 35 is connected to the base terminal 30. A phase transition material resistor 40 is connected in parallel with the bias resistor 30. In some embodiments, the bias resistor 35 is relatively temperature-insensitive. In one example, the bias resistor 35 is a polysilicon resistor. The phase transition material resistor 40 includes a phase change material, such as organic, inorganic, or solid state phase change materials. In some embodiments, the phase transition material resistor 40 includes vanadium and oxygen, such as in the form of vanadium dioxide. In some embodiments, other materials, such as various combinations of tellurium (Te), germanium (Ge), and/or antimony (Sb), with doping elements such as indium (In), oxygen (O), selenium (Se), tin (Sn), etc., are used. In some embodiments, the phase transition material resistor 40 is doped with another material, such as tungsten (W), to adjust a phase transition temperature thereof.

Figure 2:
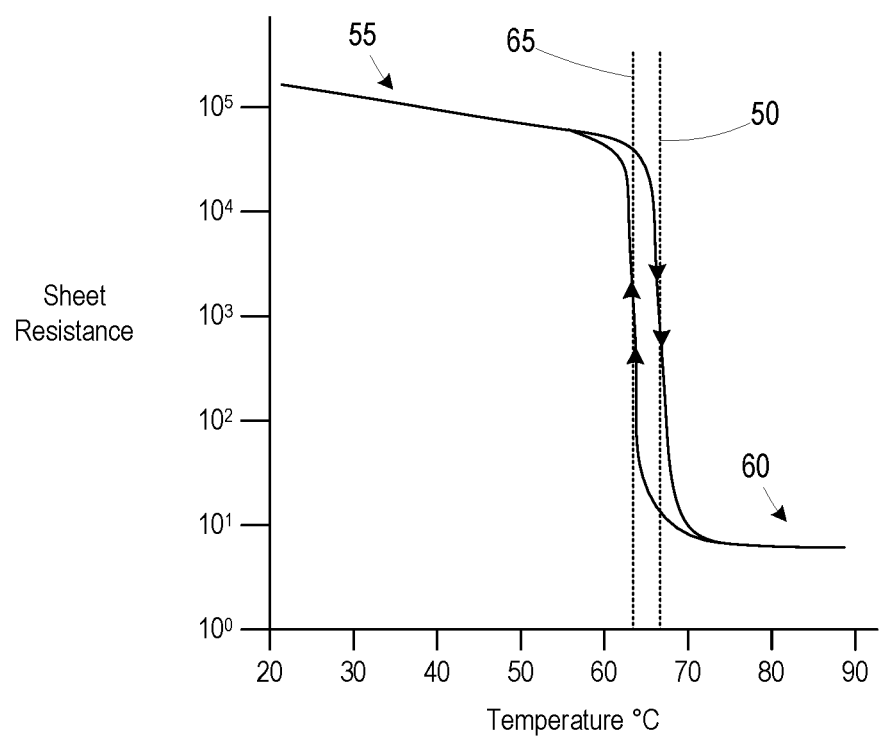
FIG. 2 is a diagram illustrating a temperature versus resistance characteristic curve for the phase transition material resistor in FIG. 1, according to some embodiments.

FIG. 2 is a diagram illustrating an approximate temperature versus resistance characteristic curve for the phase transition material resistor 40 in FIG. 1. In general, as a temperature of the device rises, the phase transition material resistor 40 undergoes a phase transition from having the low conductivity of an insulating or semiconductor material to having the high conductivity of a metal material at a particular heating transition temperature 50 (i.e., Insulator Metal Transition IMT or Semiconductor Metal Transition SMT). In some embodiments, a resistance in a low conductivity phase 55 decreases by about 4 orders of magnitude (e.g., by a factor of about 10,000) after a transition to a high conductivity phase 60. In the opposite direction (i.e., cooling), a hysteresis may be present such that a cooling transition temperature 65 associated with a phase change from the high conductivity phase 60 to the low conductivity phase 55 is lower than the heating transition temperature 50.

Returning to FIG. 1, the operation of the temperature-sensitive bias circuit 10 is described at different temperature ranges. The base voltage, $V_B$, is controlled (e.g., using a current mirror or other suitable control circuit) to generate a base current, $I_B$, sufficient to provide a constant collector current, $I_C$. At device temperatures below the heating transition temperature 50, where the phase transition material resistor 40 is in the low conductivity phase 55, the resistance of the bias resistor 35 (e.g., 1-1000 Ohm) is the major contributor to the base resistance, since the resistance of the phase transition material resistor 40 is several orders of magnitude higher than the resistance of the bias resistor 35. As the temperature of the device increases, so does the $\beta$ value of the bipolar transistor 15, and to some degree, the resistance of the bias resistor 35. The base voltage is increased to compensate for the changes in the $\beta$ value and the bias resistor 35.

As the temperature of the device continues to increase and exceeds the heating transition temperature 50, the resistance of the phase transition material resistor 40 decreases by several orders of magnitude (e.g., to about 1 kOhm or lower). The total base resistance provided by the bias resistor 35 and the phase transition material resistor 40 decreases. As a result of the reduced total resistance, the base voltage and associated base current needed to drive the bipolar transistor 15 to maintain the constant collector current decreases, thereby compensating for the temperature-induced increased $\beta$ value of the bipolar transistor 15 and resistance of the bias resistor 35.

Figure 3:
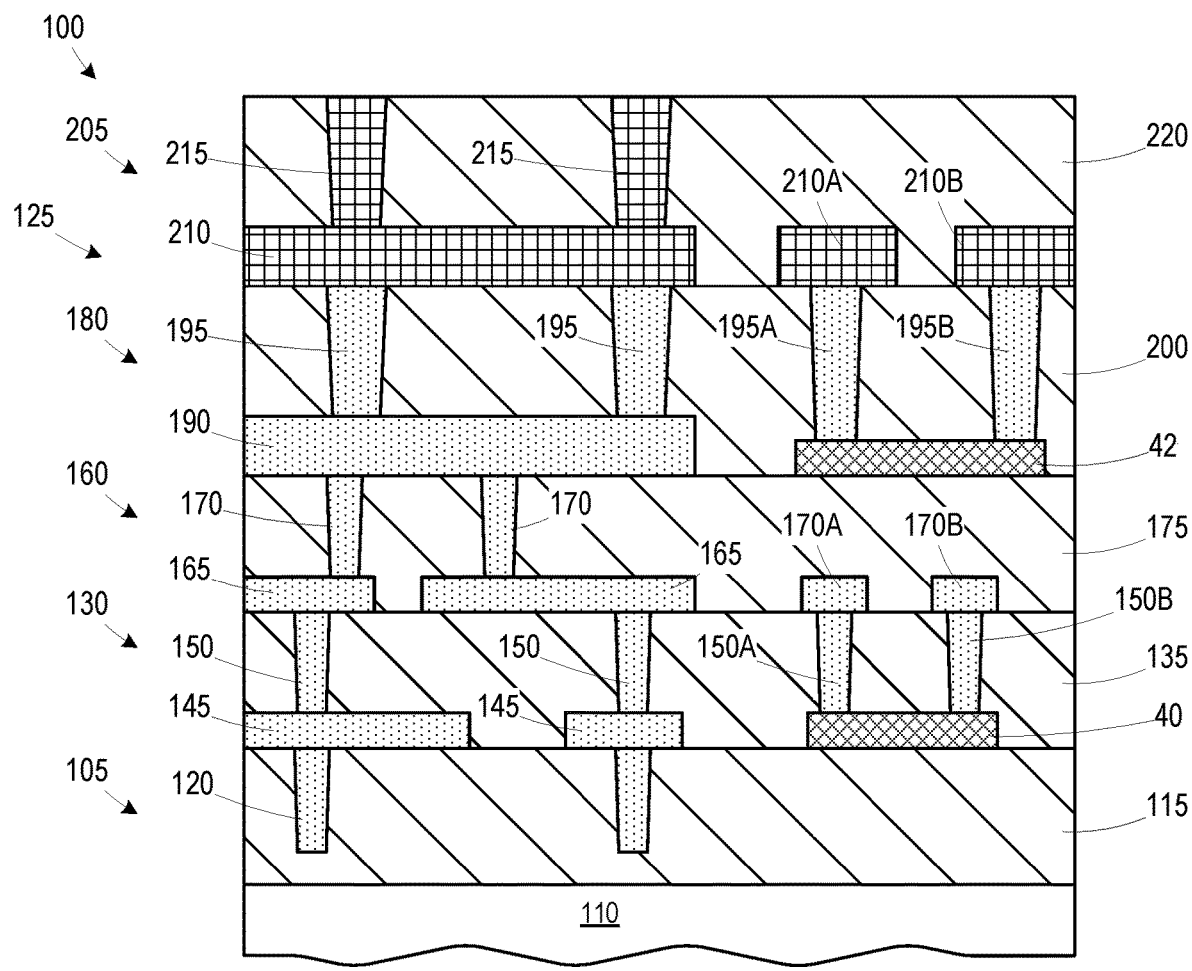
FIG. 3 is a cross-section of a semiconductor product including phase transition material resistors, according to some embodiments.

FIG. 3 is a cross-section of a semiconductor device 100 including phase transition material resistors 40, according to some embodiments. FIG. 3 illustrates the product 100 including a device layer 105 formed in and above a substrate 110 in which semiconductor-based circuit elements may be provided and covered by a dielectric layer 115. For convenience, any such circuit elements are not shown in FIG. 3. In some embodiments, the substrate 110 may be a semiconductor material, glass, sapphire, or some other substrate material. The device layer 105 includes contacts 120 (e.g., tungsten, cobalt, copper, or other suitable material) formed in the dielectric layer 115 for contacting the underlying devices, such as transistors (not shown). The substrate 110 may also include any appropriate microstructure features, such as micromechanical components, optoelectronic components and the like. The device layer 105 may include active or passive devices including but not limited to MOSFET's, bipolar transistors (e.g., such as the bipolar transistor 15), silicon-germanium heterojunction bipolar transistors (SiGe HBTs), capacitors, diodes, varactors, resistors, etc. which are electrically contacted by contacts 120.

A metallization system 125 is formed above the device layer 105 to interconnect the various components therein. In highly complex integrated circuits, a very large number of electrical connections may be required and, thus, a plurality of metallization layers may typically be formed in the metallization system 125.

A first metallization layer 130 of the metallization system 125 includes a dielectric layer 135 and one or more phase transition material resistors 40, 42 formed above the device layer 105. In some embodiments, the phase transition material resistors 40, 42 are formed by blanket depositing a material layer including vanadium and oxygen or other materials as illustrated above and patterning the material layer using a photolithography and etch process. The phase transition material resistors 40, 42 may be formed in the metallization layer 130 above different regions of the device layer 105. Due to the different vertical positioning of the phase transition material resistors 40, 42 relative to the device layer 105, the phase transition material resistors 40, 42 may respond to different temperature stimuli. For example, phase transition material resistors 40 closer to the device layer 105 respond primarily to internal heat generation resulting from device operation, while phase transition material resistors 42 positioned in an upper layer respond primarily to ambient temperature.

Portions of the first metallization layer 130 are formed using a conventional metallization process, such as a damascene process, a dual damascene process, or a subtractive etch process, to define conductive lines 145 (e.g., copper for damascene or dual damascene or aluminum for subtractive etch) to provide intra-layer signal paths and vias 150 (e.g., copper or tungsten) to provide inter-layer signal paths. The dielectric layer 135, lines 145, and vias 150 may be formed after patterning the phase transition material resistor(s) 40. Vias 150A, 150B contact the phase transition material resistor 40.

A second metallization layer 160 includes metal lines 165 and vias 170 embedded in a dielectric layer 175. Conductive lines 170A, 170B contact the vias 150A, 150B, thereby providing an interconnection for the phase transition material resistor 40. The conductive lines 170A, 170B may extend into and/or out of the page in FIG. 3.

A third metallization layer 180 also includes the phase transition material resistor 42, metal lines 190, and vias 195 embedded in a dielectric layer 200. Vias 195A, 195B contact the phase transition material resistor 42. In some embodiments, the phase transition material resistor 42 has the same transition temperature as the phase transition material resistor 40. In some embodiments, the phase transition material resistors 40, 42 have different phase transition temperatures. For example, the phase transition material resistors 40, 42 may be doped with differing concentrations of tungsten to provide different phase transition temperatures. In some embodiments, the materials of the phase transition material resistors 40, 42 are different.

A fourth metallization layer 205 includes metal lines 210 and vias 215 embedded in a dielectric layer 220. Conductive lines 210A, 210B contact the vias 195A, 195B providing an interconnection for the phase transition material resistor 42. The conductive lines 195A, 195B may extend into and/or out of the page in FIG. 3.

The materials for the dielectric layers 125, 175, 200, 220 (e.g., silicon dioxide, low-k dielectric material, ultra-low-k dielectric material, etc.), conductive lines 145, 165, 190, 210 (e.g., metals or metal alloys of tungsten, copper, cobalt, tantalum, ruthenium, aluminum, etc.), and vias 120, 150, 170, 195, 215 (e.g., metals or alloys of the same materials as the conductive lines 145, 165, 190, 210) may vary across the various metallization layers 130, 160, 180, 205. In some embodiments, cap layers (not shown—e.g., SiN, SiCN, etc.) may be formed between the dielectric layers 125, 175, 200, 220 and/or plated metal cap layers, such as CoWP, may be formed over the conductive lines 145, 165, 190, 210. Barrier layers may be formed in conjunction with the conductive lines 145, 165, 190, 210 and vias 120, 150, 170, 195, 215.

Figure 4:
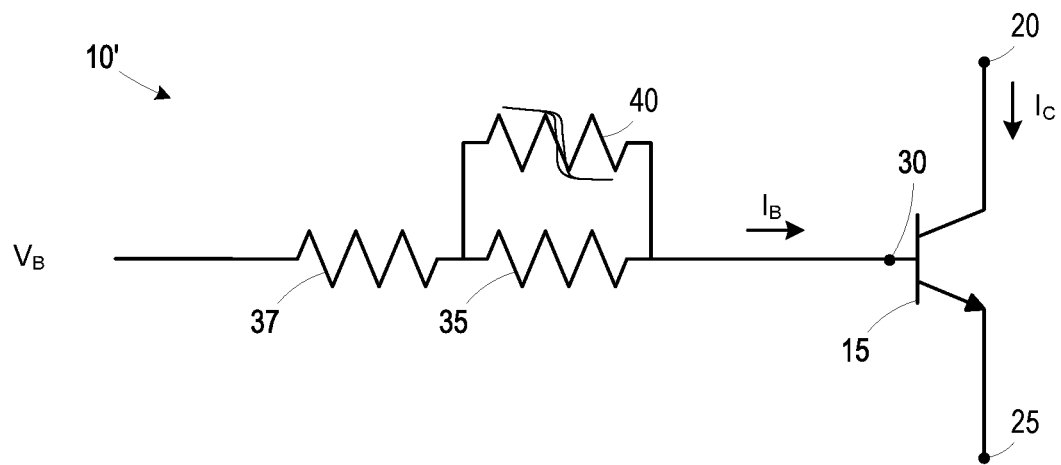
FIGS. 4 and 5 are circuit diagrams of alternative embodiments of temperature-sensitive bias circuits, according to some embodiments.

FIG. 4 is a circuit diagram of an alternative embodiment of a temperature-sensitive bias circuit 10', according to some embodiments. In the temperature-sensitive bias circuit 10', an additional bias resistor 37 is connected in series with the bias resistor 35. At device temperatures below the heating transition temperature 50, where the phase transition material resistor 40 is in the low conductivity phase 55, the base resistance is primarily attributed to the bias resistors 35, 37. As the temperature of the device increases, so does the β value of the bipolar transistor 15, and to some degree, the resistance of the bias resistors 35, 37. The base voltage is increased to compensate for the changes in the β value and the bias resistors 35, 37.

As the temperature of the device continues to increase and exceeds the heating transition temperature 50, the resistance of the phase transition material resistor 40 decreases by several orders of magnitude (e.g., to about 1 kOhm). The total base resistance provided by the bias resistors 35, 37 and the phase transition material resistor 40 decreases. As a result of the reduced total resistance, the base voltage and associated base current needed to drive the bipolar transistor 15 to maintain the constant collector current decreases, thereby compensating for the temperature-induced increased β value of the bipolar transistor 15 and resistance of the bias resistors 35, 37.

Figure 5:
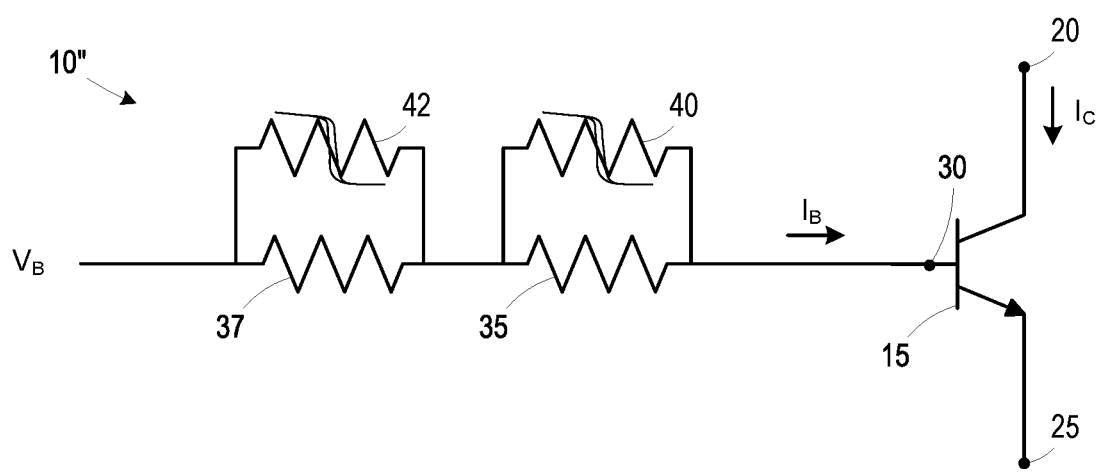

FIG. 5 is a circuit diagram of an alternative embodiment of a temperature-sensitive bias circuit 10", according to some embodiments. In the temperature-sensitive bias circuit 10", the phase transition material resistor 42 is connected in parallel with the bias resistor 37. Although two bias resistors 35, 37 and two phase transition material resistors 40, 42 are illustrated, in some embodiments, N bias resistors and M phase transition material resistors are provided. In some embodiments, the phase transition material resistors 40, 42 are positioned in different layers of the product 100. In some embodiments, the phase transition material resistors 40, 42 have different phase transition temperatures.

The use of phase transition material resistors 40, 42 in a bias circuit 10, 10', 10" provides compensation for temperature-induced changes to the characteristics of the bipolar transistor 15. The base voltage and associated base current required to provide a constant collector current for the bipolar transistor 15 at elevated temperatures is reduced compared to a device without temperature compensation. Providing different arrangements of the bias resistors 35, 37 and phase transition material resistors 40, 42 allows the total resistance during the different temperature phases to be controlled and also affects the physical sizes of the bias resistors 35, 37 and phase transition material resistors 40, 42 required to provide the desired resistance characteristics. Using multiple phase transition material resistors 40, 42 at different locations or with different phase transition temperatures allows a graded transition in the bias resistance as temperature increases.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   an active device comprising a first terminal;
   a first bias resistor connected to the first terminal; and
   a first resistor comprising a first phase transition material connected in parallel with the first bias resistor, wherein the first phase transition material exhibits a first low conductivity phase for temperatures less than a first phase transition temperature and a first high conductivity phase for temperatures greater than the first phase transition temperature.

2. The device of claim 1, further comprising a second bias resistor connected in series to the first bias resistor.

3. The device of claim 2, wherein the first and second bias resistors comprise polysilicon.

4. The device of claim 2, further comprising a second resistor comprising a second phase transition material connected in parallel with the second bias resistor, wherein the second phase transition material exhibits a second low conductivity phase for temperatures less than a second phase transition temperature and a second high conductivity phase for temperatures greater than the second phase transition temperature.

5. The device of claim 4, wherein the first resistor is positioned in a first layer above a substrate, and the second resistor is positioned in a second layer positioned above the first layer.

6. The device of claim 4, wherein the first phase transition material comprises vanadium and oxygen doped with a first concentration of tungsten, and the second phase transition material comprises vanadium and oxygen doped with a second concentration of tungsten different than the first concentration.

7. The device of claim 1, wherein the first phase transition material comprises vanadium and oxygen.

8. The device of claim 1, wherein the active device comprises a bipolar transistor, and the first terminal comprises a base terminal.

9. A device, comprising:
an active device comprising a first terminal;
a first bias resistor connected to the first terminal;
a first resistor comprising a first phase transition material connected in parallel with the first bias resistor, wherein the first phase transition material exhibits a first low conductivity phase for temperatures less than a first phase transition temperature and a first high conductivity phase for temperatures greater than the first phase transition temperature;
a second bias resistor connected in series to the first bias resistor; and
a second resistor comprising a second phase transition material connected in parallel with the second bias resistor, wherein the second phase transition material exhibits a second low conductivity phase for temperatures less than a second phase transition temperature and a second high conductivity phase for temperatures greater than the second phase transition temperature, wherein the first phase transition temperature is different than the second phase transition temperature.

10. The device of claim 9, wherein the first and second bias resistors comprise polysilicon.

11. The device of claim 10, wherein the first resistor is positioned in a first layer above a substrate, and the second resistor is positioned in a second layer positioned above the first layer.

12. The device of claim 10, wherein the first phase transition material comprises vanadium and oxygen doped with a first concentration of tungsten, and the second phase transition material comprises vanadium and oxygen doped with a second concentration of tungsten different than the first concentration.

13. The device of claim 10, wherein the active device comprises a bipolar transistor, and the first terminal comprises a base terminal.

14. A method, comprising:
connecting a bias circuit to a base terminal of a bipolar transistor; and
reducing a resistance of the bias circuit responsive to a temperature of the bias circuit exceeding a first predetermined temperature.

15. The method of claim 14, wherein the bias circuit comprises a first bias resistor connected to the base terminal and a first resistor comprising a first phase transition material connected in parallel with the first bias resistor, wherein the first phase transition material exhibits a first low conductivity phase for temperatures less than the first predetermined temperature and a first high conductivity phase for temperatures greater than the first predetermined temperature.

16. The method of claim 14, wherein the bias circuit comprises a second bias resistor connected to the first bias resistor.

17. The method of claim 16, further comprising a second resistor comprising a second phase transition material connected in parallel with the second bias resistor, wherein the second phase transition material exhibits a second low conductivity phase for temperatures less than a second phase transition temperature and a second high conductivity phase for temperatures greater than the second phase transition temperature.

18. The method of claim 17, wherein the first and second bias resistors comprise polysilicon.

19. The method of claim 17, wherein the first phase transition temperature is different than the second phase transition temperature.

* * * * *